United States Patent [19]
Nakakura et al.

[11] Patent Number: 4,780,428
[45] Date of Patent: * Oct. 25, 1988

[54] MOSFET SEMICONDUCTOR DEVICE AND MANUFACTURING METHOD THEREOF

[75] Inventors: Yukinori Nakakura; Nobuyuki Kato, both of Nara, Japan

[73] Assignee: Sharp Kabushiki Kaisha, Osaka, Japan

[*] Notice: The portion of the term of this patent subsequent to Sep. 22, 2004 has been disclaimed.

[21] Appl. No.: 60,304

[22] Filed: Jun. 10, 1987

Related U.S. Application Data

[63] Continuation of Ser. No. 838,830, Mar. 12, 1986, Pat. No. 4,695,479.

[30] Foreign Application Priority Data

Mar. 15, 1985 [JP] Japan ................................. 60-52608

[51] Int. Cl.[4] ........................................ H01L 21/265
[52] U.S. Cl. ..................................... 437/40; 437/239; 427/99; 427/255.1
[58] Field of Search ............... 427/99, 255.1; 437/228, 437/40, 239

[56] References Cited

U.S. PATENT DOCUMENTS

| | | | |
|---|---|---|---|
| 3,971,061 | 7/1976 | Matsushita | 357/58 |
| 3,977,019 | 8/1976 | Matsushita | 357/46 |
| 4,086,613 | 4/1978 | Biet | 357/55 |
| 4,339,285 | 7/1982 | Pankove | 427/53.1 |
| 4,420,765 | 12/1983 | Tarng | 357/54 |
| 4,489,103 | 12/1984 | Goodman | 427/255.3 |
| 4,574,466 | 3/1986 | Hagner | 156/657 |
| 4,695,479 | 9/1987 | Nakakura | 437/228 |

Primary Examiner—Shrive P. Beck
Assistant Examiner—Vi Duong Dang
Attorney, Agent, or Firm—Birch, Stewart, Kolasch, & Birch

[57] ABSTRACT

A method of forming a gate insulating film on a MOSFET. After a $SiO_2$ film is formed by thermal oxidation as a gate insulating film on a MOSFET, the $SiO_2$ film is removed by selective etching from the surface area other than MOSFET region, and an oxygen doped semi-insulating polycrystalline silicon film is deposited thereon. Then, a silicon nitride layer is deposited and a $SiO_2$ film is formed by CVD method on the surface area other than the MOSFET region.

17 Claims, 3 Drawing Sheets

MOSFET SEMICONDUCTOR DEVICE AND MANUFACTURING METHOD THEREOF

This application is a continuation of copending application Ser. No. 838,830, filed on Mar. 12, 1986 now U.S. Pat. No. 4,695,479.

BACKGROUND OF THE INVENTION

The present invention relates to a monolithic semiconductor device in which a MOSFET is incorporated in a chip to provide zero cross function, and to a manufacturing method thereof.

There has been no prior art for the method of producing gate insulating film of an AC 200V zero cross photo triac. The localized oxidation of oxygen doped polycrystalline silicon film for producing MOS-IC gate insulating film may be considered as an equivalent technique. As indicated in FIG. 2, the localized oxidation process comprises the steps of diffusing a silicon wafer 10, removing the entire $SiO_2$ film from the semiconductor substrate surface, depositing an oxygen doped polycrystalline silicon film 11 and a $SiO_2$ film formed through chemical vapor deposition (hereinafter abbreviated as CVD $SiO_2$ film) 12 successively, removing the CVD $SiO_2$ film 12 selectively by photo-etching and wet-etching, and thermally oxidizing the oxygen doped polycrystalline silicon film 11 in the surface area from which the CVD $SiO_2$ film 12 has been removed. The $SiO_2$ film 12 used as a MOS gate insulating film (indicated by 13) is produced by the above process. Meanwhile, the oxygen doped polycrystalline silicon film in the area where the CVD $SiO_2$ film 12 is left unremoved will remain unoxidized due to the thickness of the CVD $SiO_2$ film 12. The passivation effect is therefore retained.

With the above conventional method in which the oxygen doped polycrystalline silicon film 11 is thermally oxidized after being deposited, the silicon grain size in the oxygen doped polycrystalline silicon film 11 changes during the oxidation process at a high temperature (T=1,100° C. or higher), causing reduced passivation effect and increased leak current in the P-N junction. Accordingly, permitted gate oxidizing temperature and time are restricted below 1,100° C. and below 30 minutes, which limits the oxide film thickness to 2,000~3,000 Å at maximum.

The limited oxide film thickness is a fatal barrier for realizing a MOSFET which requires high gate insulation breakdown voltage resistance.

SUMMARY OF THE INVENTION

An objective of the present invention is to provide a monolithic semiconductor device which avoids the above conventional problem, and a manufacturing method thereof.

Another objective of the present invention is to provide a semiconductor device having an insulating film in a MOSFET with a high breakdown voltage resistance, and a manufacturing method thereof.

Another objective of the present invention is to provide a method of forming a gate insulating film for a MOSFET with a high gate breakdown voltage resistance.

Other objectives and further scope of applicability of the present invention will become apparent from the detailed description given hereinafter. It should be understood, however, that the detailed description and specific examples, while indicating preferred embodiments of the invention, are given by way of illustration only; various changes and modifications within the spirit and scope of the invention will become apparent to those skilled in the art from this detailed description.

To achieve the above objectives, according to an embodiment of the present invention, a gate insulating film is first formed through thermal oxidation. An oxygen doped semi-insulating polycrystalline silicon film is then deposited thereon for protection of the chip field area. The silicon film formed on the MOSFET region (gate area) is removed by etching. Then, a thick $SiO_2$ film is formed by CVD method on the surface area other than the MOSFET region, for electrical insulation from the electrodes. A silicon nitride film is used to separate the CVD $SiO_2$ film from the thermally oxidized $SiO_2$ film (gate oxide film).

More specifically, a $SiO_2$ film is formed by thermal oxidation as a gate insulating film of a MOSFET, and the $SiO_2$ film is removed from the surface area other than the MOSFET region by selective etching. After an oxygen doped semi-insulating polycrystalline silicon film is deposited, a silicon nitride film and a CVD $SiO_2$ film are successively formed on the surface area other than the MOSFET region.

According to the above process, since the gate insulating oxide film is formed before the oxygen doped semi-insulating polycrystalline silicon film, the insulating oxide film can be made thick as desired. The CVD $SiO_2$ film provides electrical insulation from the electrodes, and the silicon nitride film separates the CVD $SiO_2$ film from the thermally oxidized $SiO_2$ film which serves as a gate insulating oxide film.

BRIEF DESCRIPTION OF THE DRAWINGS

The present invention will become more fully understood from the detailed description given hereinbelow and the accompanying drawings which are given by way of illustration only, and thus are not limitative of the present invention and wherein.

DETAILED DESCRIPTION OF THE INVENTION

Figure 1:
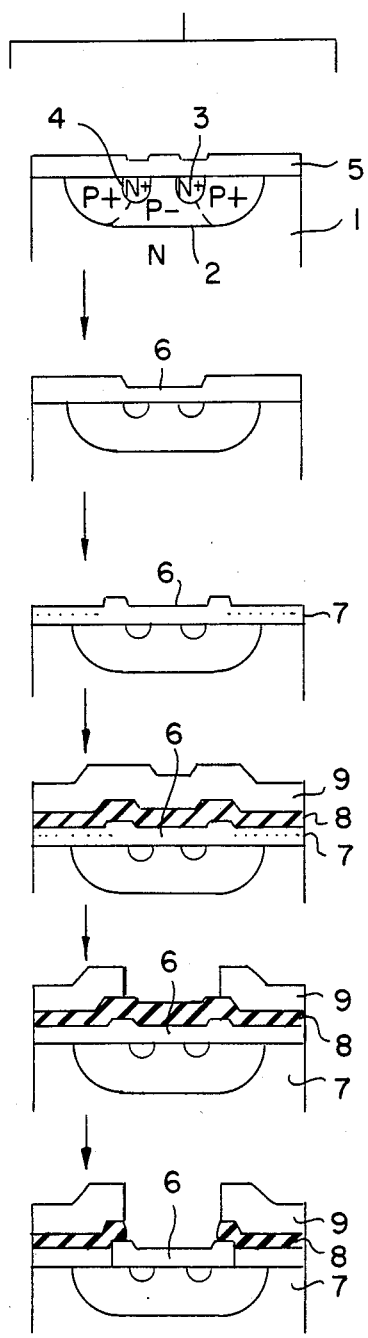
FIG. 1 is a process chart for explaining an embodiment of the present invention.
Figure 2:
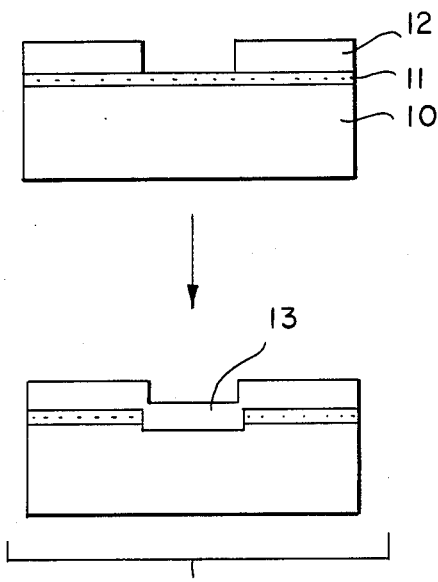
FIG. 2 is a process chart showing the conventional manufacturing method.

FIG. 1 shows a specific process of manufacturing the gate insulating film according to the present invention. P-well region 2, n-type source region 3 and n-type drain region 4 are formed by diffusion in an n-type semiconductor substrate (wafer) 1. After the diffusion process, the $SiO_2$ is removed from the MOSFET region by selective etching. A $SiO_2$ film ($t_{ox}$=about 1.2 μm) 6 is then formed through thermal oxidation as a gate insulating film, and the $SiO_2$ film 6 is removed from the surface area other than the MOSFET region by selective etching. An oxygen doped semi-insulating polycrystalline silicon film (oxygen concentration=about 15~35 atm %, t=about 2,000 Å) 7 is then formed by chemical vapor deposition as a protective film under reduced pressure. The polycrystalline silicon film 7 is selectively removed from the MOSFET region by $CF_4$ gas plasma etching. Since the etching rate of the oxygen doped semi-insulating polycrystalline silicon 7 is sufficiently high compared to that of the base SiO$_2$ film (gate insulating film) 6, the thickness reduction of the base SiO$_2$ film 6 by possible over-etching is negligibly small if the etching operation is controlled by a general optical sensor for end point detection.

Then, a silicon nitride film (t=about 1,000 Å) 8 is deposited through the chemical vapor deposition under reduced pressure. Successively, a CVD SiO$_2$ film 9 is formed for preventing insulation breakdown by wired electrodes. The silicon nitride film 8 electrically separates the CVD SiO$_2$ film 9 from the thermally oxidized SiO$_2$ film (gate insulating film) 6 as well as protecting the area other than the MOSFET region. The CVD SiO$_2$ film 9 is then removed from the MOSFET region by photo-etching and wet-etching (using a so-called buffer etchant HF:NH$_4$F=1:4). Since the etching rate of the base silicon nitride film 8 is extremely small (about 15 Å/min) its thickness reduction is negligibly small. The silicon nitride film 8 is removed by plasma etching. Again, the thickness reduction of the thermally oxidized base SiO$_2$ film 6 is negligibly small because of the small etching rate.

Thus, according to the present invention, it is easy to limit the thickness reduction by the total two plasma etchings of the thermally oxidized base SiO$_2$ film 6, within 5% of its entire thickness. Thermal treatment (T=about 1000° C.) and electrode formation processes following after the above process are well known and therefore their description is omitted here. The gate insulating film may be of two-layer construction composed of the thermally oxidized SiO$_2$ film 6 and the silicon nitride film 8. In this case, the silicon nitride film 8 is not removed from the MOSFET region and used as a part of the gate insulating film. In the present embodiment, the oxygen doped semi-insulating polycrystalline silicon film in a single layer is used as the protective film 7 under the silicon nitride film 8. Alternatively, the protective film 7 may be of two-layer construction using a so-called poly silicon film, or of multi-layer construction with poly silicon films. The principle of the production process for these alternative constructions is the same as that for the present embodiment.

According to the present invention, as clear from the above description, the SiO$_2$ film 6 is first formed by thermal oxidation as a gate insulating film, so that the gate oxide film 6 can be make thick. For example, with t$_{ox}$=about 1.2 μm, gate insulation break-down voltage is about 900 V.

Figure 3:
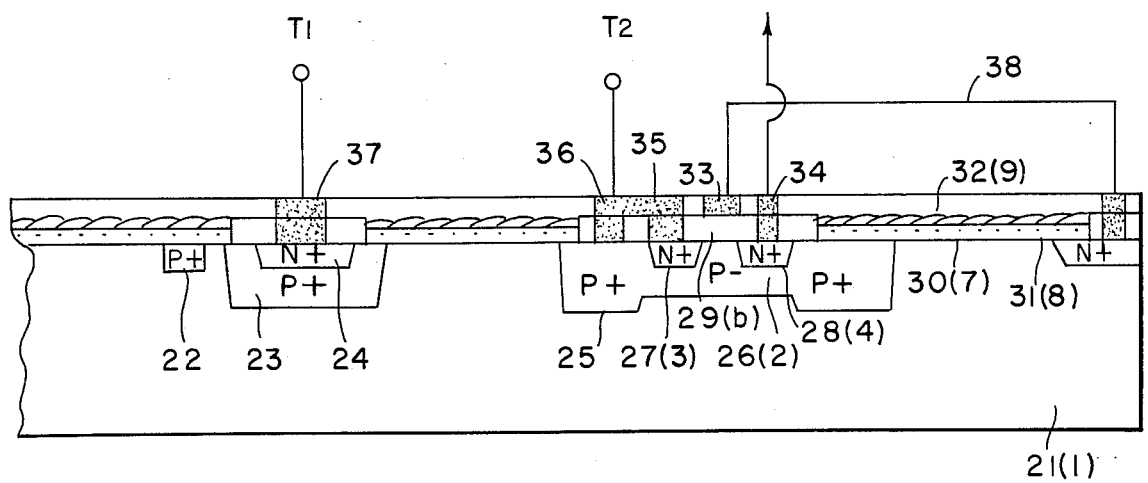
FIG. 3 is a sectional view of a chip manufactured by the method of the present invention.
Figure 4:
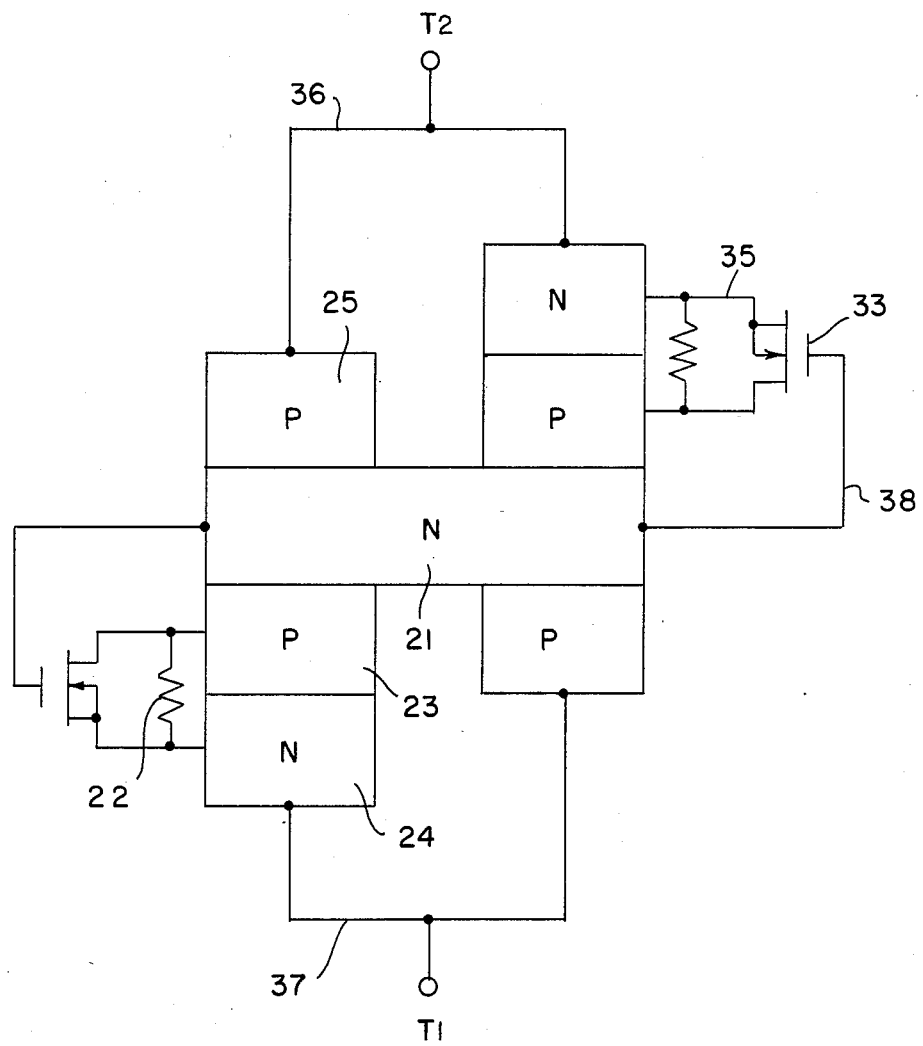
FIG. 4 is a circuit diagram equivalent to the chip of FIG. 3.

For reference, a zerocross photo triac chip obtained through the above manufacturing process is shown in section in FIG. 3, and its equivalent circuit in FIG. 4. In FIG. 3, the numbers enclosed in parentheses are those used for referring the parts in FIG. 1. The reference numbers in FIG. 4 correspond with those in FIG. 3.

In FIG. 3, 21(1) is an n-type semiconductor substrate, 22 is a resistance R$_{GK}$ diffused area, 23 is a P gate diffused area, 24 is a cathode diffused area, 25 is an anode diffused area, 26(2) is a P well diffused area, 27(3) is a source diffused area, 28(4) is a drain diffused area, 29(6) is a MOS gate insulating film (thermally oxided SiO$_2$ film), 30(7) is an oxygen doped semi-insulating polycrystalline silicon film, 31(8) is a silicon nitride film, 32(9) is a CVD SiO$_2$ film, 33 is a MOS gate electrode, 34 is a drain electrode, 35 is a source electrode, 36 is an anode electrode (T$_2$ electrode), 37 is a cathode electrode (T$_1$ electrode) and 38 is a MOS gate wiring.

Manufacturing method for a gate insulating film of a zerocross photo triac chip has been described above. The present invention is also applicable to other MOSFET's that require high breakdown voltage resistance.

According to the present invention, as mentioned above, it is possible to produce a gate insulating film with a high breakdown voltage resistance.

The present invention may be applied to a monolithic semiconductor device with a zerocross function in a planar photo triac on the photo sensing side of a firing SSR (Solid-State Relay) which is used for ON/OFF control of a power triac. The present invention also relates to a manufacturing method for a photo triac chip with MOSFET incorporated therein to provide a zerocross function. The present invention may be applied to a MOSFET in an AC200V photo triac chip with the rated breakover voltage of 600 V, though the breakover voltage requirement of the chip varies depending on its application. The rated breakover voltage is directly applied to the MOS gate. The present invention can realize a gate insulating film of a MOSFET whose gate breakdown voltage is about 600 V or higher.

While only certain embodiments of the present invention have been described, it will be apparent to those skilled in the art that various changes and modification may be made therein without departing from the spirit and scope of the present invention as claimed.

What is claimed is:

1. A method of forming a MOSFET gate insulating film comprising the steps of:
    forming a first SiO$_2$ film as a gate insulating film on a MOSFET surface;
    removing the first SiO$_2$ film from the surface area other than the MOSFET region;
    depositing an oxygen doped semi-insulating polycrystalline silicon film;
    removing the oxygen doped semi-insulating polycrystalline silicon film from the MOSFET region; and
    depositing a silicon nitride film and a second SiO$_2$ film.

2. The method of claim 1, wherein the first SiO$_2$ film is formed by thermal oxidation.

3. The method of claim 1, wherein the first SiO$_2$ film and the oxygen doped semi-insulating polycrystalline silicon film are removed by selective etching.

4. The method of claim 3, wherein the oxygen doped semi-insulating polycrystalline silicon film is selectively removed by CF$_4$ gas plasma etching.

5. The method of claim 1, wherein the oxygen doped semi-insulating polycrystalline silicon film, the silicon nitride film and the second SiO$_2$ film are formed by chemical vapor deposition.

6. The method of claim 5, wherein the oxygen doped semi-insulating polycrystalline silicon film and the silicon nitride film are formed by chemical vapor deposition under reduced pressure.

7. The method of claim 1, further comprising the step of removing the second SiO$_2$ film from the MOSFET region.

8. The method of claim 7, further comprising the step of removing the silicon nitride film from the MOSFET region.

9. The method of claim 8, wherein the second SiO$_2$ film and the silicon nitride film are removed by etching.

10. The method of claim 9, wherein the silicon nitride film is removed by plasma etching.

11. The method of claim 9, wherein the second $SiO_2$ film is removed by photoetching and/or wet-etching.

12. The method of claim 7, wherein the silicon nitride film layering on the first $SiO_2$ film functions as the gate insulating film in combination.

13. The method of claim 1, wherein the oxygen doped semi-insulating polycrystalline silicon film is formed by depositing a two-layer polysilicon film or a multilayer polysilicon film.

14. The method of claim 1, wherein the silicon nitride film and the second $SiO_2$ are deposited at least on the surface area other than the MOSFET region.

15. The method of claim 1, wherein the silicon nitride film is formed for electrically separating the second $SiO_2$ film from the first $SiO_2$ film.

16. The method of claim 1, wherein the second $SiO_2$ film is formed for preventing insulating breakdown.

17. The method of claim 1, wherein the first $SiO_2$ film is reduced in thickness by less than 5 percent from the initial thickness of the first $SiO_2$ film after the oxygen doped semi-insulating polycrystalline film is selectively removed by $CF_4$ gas plasma etching and the silicon nitride film is removed by plasma etching.

* * * * *